(12) United States Patent
Snow et al.

(10) Patent No.: US 11,367,551 B2
(45) Date of Patent: Jun. 21, 2022

(54) LARGE MOMENTS IN BCC $FE_xCO_yMN_z$ AND OTHER ALLOY THIN FILMS

(71) Applicants: Montana State University, Bozeman, MT (US); The Regents of The University of California, Oakland, CA (US)

(72) Inventors: Ryan J. Snow, Bozeman, MT (US); Yves U. Idzerda, Bozeman, MT (US); Elke Arenholz, Berkeley, CA (US)

(73) Assignees: Montana State University, Bozeman, MT (US); The Regents of The University of California, Oakland, CA (US)

(*) Notice: Subject to any disclaimer, the term of this patent is extended or adjusted under 35 U.S.C. 154(b) by 38 days.

(21) Appl. No.: 16/954,983

(22) PCT Filed: Dec. 14, 2018

(86) PCT No.: PCT/US2018/065779
§ 371 (c)(1),
(2) Date: Jun. 17, 2020

(87) PCT Pub. No.: WO2019/125954
PCT Pub. Date: Jun. 27, 2019

(65) Prior Publication Data
US 2020/0312510 A1    Oct. 1, 2020

Related U.S. Application Data

(60) Provisional application No. 62/629,664, filed on Feb. 12, 2018, provisional application No. 62/608,448, filed on Dec. 20, 2017.

(51) Int. Cl.
*H01F 10/14* (2006.01)
*H01F 10/16* (2006.01)
(Continued)

(52) U.S. Cl.
CPC .......... *H01F 10/147* (2013.01); *G11B 5/656* (2013.01); *G11B 5/7368* (2019.05);
(Continued)

(58) Field of Classification Search
None
See application file for complete search history.

(56) References Cited

U.S. PATENT DOCUMENTS 4,933,026 A * 6/1990 Rawlings ................ C22C 19/07
                                                             148/311
6,342,311 B1 * 1/2002 Inturi .................... G11B 5/3143
                                                             360/128
(Continued)

OTHER PUBLICATIONS

International Preliminary Report on Patentability from International Application No. PCT/US2018/065779, dated Jun. 23, 2020, 7 pages.
(Continued)

*Primary Examiner* — Kevin M Bernatz
(74) *Attorney, Agent, or Firm* — Klarquist Sparkman, LLP

(57) ABSTRACT

Large magnetic moment compositions are formed by stabilizing ternary or other alloys with a epitaxial control layer. Compositions that are unstable in bulk specimen are thus stabilized and exhibit magnetic moments that are greater that a Slater-Pauling limit. In one example, $Fe_xCo_yMn_z$ layers are produced on an MgO(001) substrate with an MgO surface serving to control the structure of the $Fe_xCo_yMn_z$ layers. Magnetizations greater than 3 Bohr magnetons are produced.

18 Claims, 8 Drawing Sheets

(51) Int. Cl.
*H01F 10/30* (2006.01)
*H01F 41/32* (2006.01)
*G11B 5/65* (2006.01)
*G11C 11/14* (2006.01)
*G11B 5/73* (2006.01)
*G01R 33/09* (2006.01)
*G11C 11/16* (2006.01)
*G11B 5/82* (2006.01)
*G01R 33/00* (2006.01)

(52) U.S. Cl.
CPC .......... *G11B 5/7377* (2019.05); *G11B 5/7379* (2019.05); *G11C 11/14* (2013.01); *H01F 10/16* (2013.01); *H01F 10/30* (2013.01); *H01F 41/32* (2013.01); *G01R 33/0052* (2013.01); *G01R 33/09* (2013.01); *G11B 5/82* (2013.01); *G11C 11/161* (2013.01)

(56) References Cited

U.S. PATENT DOCUMENTS

| | | | | |
|---|---|---|---|---|
| 6,562,487 | B1* | 5/2003 | Vas'ko | G11B 5/1278 360/128 |
| 8,320,077 | B1* | 11/2012 | Tang | G11B 5/3146 360/125.12 |
| 8,406,040 | B2 | 3/2013 | Worledge et al. | |
| 8,687,321 | B2 | 4/2014 | Yamada et al. | |
| 9,773,512 | B2* | 9/2017 | Gubbins | G11B 5/3912 |
| 2005/0271904 | A1* | 12/2005 | Li | C22C 38/10 428/842.1 |
| 2007/0128470 | A1 | 6/2007 | Nagahama et al. | |
| 2007/0195592 | A1* | 8/2007 | Yuasa | H01L 27/11507 365/171 |
| 2007/0230044 | A1* | 10/2007 | Han | G11B 5/1278 360/125.04 |
| 2009/0316303 | A1* | 12/2009 | Yamada | H03B 15/006 360/234.3 |
| 2010/0073828 | A1 | 3/2010 | Wang et al. | |
| 2011/0171493 | A1* | 7/2011 | Worledge | G11C 11/161 428/800 |

OTHER PUBLICATIONS

Horwath et al., "High Temperature Properties and Aging-Stress Related Changes of FeCo Materials," Final Report for Oct. 1, 2001-May 30, 2006, Air Force Research Laboratory, 7 pages (Jul. 2006).

International Search Report and Written Opinion from International Application No. PCT/US2018/065779, dated Mar. 8, 2019, 8 pages.

Jain et al., "Study of the Electronic Structure, Magnetic and Elastic Properties and Half-Metallic Stability on Variation of Lattice Constants for CoFeCrZ (Z=P, As, Sb) Heusler Alloys," *Journal of Superconductivity and Novel Magnetism*, 12 pages (Dec. 9, 2017).

Schanzer, "Investigation of interlayer exchange coupling in ferro-/antiferro-/ferromagnetic trilayers," Dissertation, 10 pages (Oct. 20, 2005).

Snow et al., "Large moments in bcc $Fe_xCo_yMn_z$ ternary alloy thin films," *Applied Physics Letters*, 112:072403-1-072403-4 (Feb. 13, 2018).

Wu et al., "Magnetic structure of $CO_{1-x}Mn_x$ alloys," *Physical Review B*, 63:214403-1-214403-8 (Apr. 30, 2001).

* cited by examiner

LARGE MOMENTS IN BCC FE$_x$CO$_y$MN$_z$ AND OTHER ALLOY THIN FILMS

CROSS REFERENCE TO RELATED APPLICATIONS

This is the U.S. National Stage of International Application No. PCT/US2018/065779, filed Dec. 14, 2018, which was published in English under PCT Article 21(2), which in turn claims the benefit of U.S. Provisional Patent Application No. 62/629,664, filed Feb. 12, 2018, and U.S. Provisional Patent Application No. 62/608,448, filed Dec. 20, 2017, which are incorporated herein by reference in their entireties.

ACKNOWLEDGMENT OF GOVERNMENT SUPPORT

This invention was made with government support under Contract No. DE-AC02-05CH11231 awarded by the U.S. Department of Energy. The government has certain rights in the invention.

BACKGROUND

Large magnetic moment materials are essential components in a variety of technologies but are increasingly important, and in many cases are the major limiting factor, in information processing and data storage. For ultrathin film application, large moments are particularly important in high density memory applications, spin torque hierarchies, BH-energy product device structures, the control of spinor applications in nanoscale non-collinear magnets, and in establishing enhanced electron spin-polarizations at the fermi-level. Increasing the average atomic moment of these films could significantly improve their performance. In addition, epitaxial ultrathin films offer opportunities in spin-transport performance control through the modification of magnetic properties due to the reduced dimensionality and structural distortions created by film/lattice mismatches.

The establishment of high moment alloy films typically includes the incorporation of transition metal elements that have large moments. The magnetic moments for transition metal binary alloys are conventionally displayed in the form of a plot of the saturation magnetization density ($M_S$) or moment per atom as a function of the total number of electrons per atom. As implemented by Slater and Pauling, the Slater-Pauling (SP) curve is displayed in the form of a triangle-shaped graph depicting a linear variation (first increasing, then decreasing) of the mean atomic moment in Bohr magnetons/atom ($\mu_B$/atom) regardless of the atom type. The maximum achievable moment for binary alloys is 2.45$\mu_B$/atom at an electron number of 26.3 electrons per atom for a bcc Fe$_{70}$Co$_{30}$ alloy (often referred to as the Slater-Pauling limit). However, materials with larger moments are desirable, and the inventors of the present disclosure have found surprisingly high moments in ternary alloy materials, as described below.

SUMMARY

Compositions comprise an epitaxially enhanced magnetic layer (EEML) consisting of one or more of Fe$_{x1}$Co$_{y1}$Mn$_{z1}$, Fe$_{x2}$Co$_{y2}$Cr$_{z2}$, Fe$_{x3}$Co$_{y3}$V$_{z3}$, and/or fe$_w$Co$_{x4}$Mn$_{y4}$Cr$_{z4}$ or any mixture thereof that exhibits a magnetic moment per atom of at least 1$\mu_B$, wherein x1, y1, z1, x2, y2, z2, x3, y3, z3, w, x4, y4, z4 are positive numbers such that x1+y1+z1=1, x2+y2+z2=1, x3+y3+z3=1, and w+x4+y4+z4=1, and $\mu_B$ is a Bohr magneton. The EEML is coupled to an epitaxial control layer associated with a composition of the EEML. In some examples, the EEML has a thickness that is less than 100 nm. In representative examples, the epitaxial control layer is one or more of MgO, ZnSe, and GaAs. In particular examples, the EEML is Fe$_{x1}$Co$_{y1}$Mn$_{z1}$ and the epitaxial control layer is MgO(001). In other examples, the EEML consists essentially of Fe$_x$Co$_y$Cr$_z$, Fe$_x$Co$_y$V$_z$, or Fe$_w$Co$_{x4}$Mn$_{y4}$Cr$_{z4}$. In typical examples, an average magnetic moment per atom is greater than 2.45$\mu_B$ or greater than 3.0$\mu_B$. In some embodiments, the EEML is Fe$_{x1}$Co$_{y1}$Mn$_{z1}$ and has an average magnetic moment per atom greater than 2.5$\mu_B$. According to some examples, an electron number is greater than 26. In typical applications, memory devices include such compositions.

According to additional representative examples, compositions comprise one or more layers of any of Fe$_{x1}$Co$_{y1}$Mn$_{z1}$, Fe$_{x2}$Co$_{y2}$Cr$_{z2}$, Fe$_{x3}$Co$_{y3}$V$_{z3}$, and/or fe$_w$Co$_{x4}$Mn$_{y4}$Cr$_{z4}$ or any mixture thereof having a magnetic moment per atom of at least 2.5$\mu_B$, wherein x1, y1, z1, x2, y2, z2, x3, y3, z3, w, x4, y4, z4 are positive numbers such that x1+y1+z1=1, x2+y2+z2=1, x3+y3+z3=1, and w+x4+y4+z4=1, and μB is a Bohr magneton. An epitaxial control layer is situated adjacent the one or more layers. In typical examples, each of the one or more layers is an EEML. In a specific example, the epitaxial control layer is an MgO(100) layer, the magnetic moment per atom is at least 2.0 μB, and the one or more layers have a total thickness that is less than 100 nm.

Methods comprise selecting a composition that includes three or more of Fe, Co, Mn, Cr, V and selecting an epitaxial control layer (ECL). The selected composition is deposited on or proximate the epitaxial control layer to produce an EEML having a thickness that is less than 100 nm and a magnetic moment per atom of at least 2.0 μB. In representative embodiments, the composition is one or more of Fe$_{x1}$Co$_{y1}$Mn$_{z1}$, Fe$_{x2}$Co$_{y2}$Cr$_{z2}$, Fe$_{x3}$Co$_{y3}$V$_{z3}$, and/or Fe$_w$Co$_{x4}$Mn$_{y4}$Cr$_{z4}$ or any mixture thereof, wherein x1, y1, z1, x2, y2, z2, x3, y3, z3, w, x4, y4, z4 are positive numbers such that x1+y1+z1=1, x2+y2+z2=1, x3+y3+z3=1, and w+x4+y4+z4=1.

DETAILED DESCRIPTION

Figure 1A:
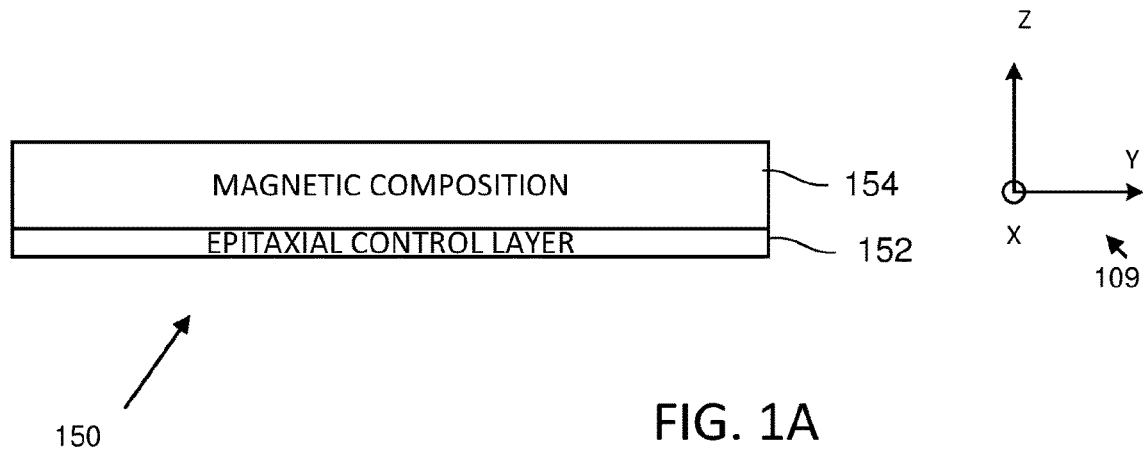
FIG. 1A illustrates a representative stable ternary film having a large magnetic moment per atom.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements or films between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

In some examples, values, procedures, compositions, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections.

Examples are described with reference to directions indicated as "above," "below," "upper," "lower," and the like. These terms are used for convenient description, but do not imply any particular spatial orientation.

The disclosure pertains generally to epitaxially-stabilized films having high magnetic moments such as ternary compositions $Fe_xCo_yMn_z$, $Fe_xCo_yCr_z$, and/or $Fe_xCo_yV_z$, or other transition metals, and combinations of such compositions, wherein x+y+z=1 (or as percentages such that x+y+z=100). Such materials can be formed as stable films that exhibit high magnetic moments per atom and/or high magnetization density. In other examples, quaternary compositions such as $Fe_wCo_xMn_yCr_z$ are stabilized, wherein w, x, y, z are positive numbers such that w+x+y+z=1 (or as percentages such that w+x+y+z=100). With suitable epitaxial substrate/overlayer lattice choices, structural stability can be extended beyond ranges that are available in the bulk, including stabilization of film structures not present in a bulk phase diagram. As used herein, such epitaxially-stabilized layers or films are termed "Epitaxially Enhanced Magnetic Layers", or EEMLs, and are characterized by having structures that would be unstable in bulk samples of the same composition. The use of epitaxial lattice mismatch can both stabilize layer structures and enhance magnetic properties. Layers used to provide such stabilization are referred to herein as epitaxial control layers.

Such epitaxial thin films are associated with magnetic alignment of the individual elements of the film, enhancing each or some of the individual elemental magnetic moments, thereby affecting or improving various magnetic properties of the film. For example, these EEML-based structures can permit enhancement of one or more of film magnetization, BH-energy product, spin polarization at the Fermi level, magnetoresistance, spin damping, spin torque, spin pumping, spin filtering, spin tunneling, spin wave properties, magnetic detection devices, or any other magnetic devices.

The disclosed compositions are formed as films of typical thicknesses of less than 0.5 nm, 0.7 nm, 1 nm, 1.5 nm, 2 nm, 5 nm, 10 nm, 20 nm, 50 nm, 100 nm, 300 nm, 1 µm on substrates that are suitably lattice matched to the ternary compositions. In some examples, crystalline or polycrystalline MgO, GaAs, or ZnSe layers are used as substrates in forming the films, and particularly (001) or (100) surfaces of such substrates. The bcc growth can result in metastable films or forced structures. In the case of pure bcc Co, the films are known to be forced structures in that they are inherently unstable. Once the film thickness is large enough so that the growing volume energies (which depend on film thickness) become greater than the interfacial stabilizing energies (which are independent on film thickness), the films convert to a different phase. A metastable film, in principle, has no thickness limitation.

Such materials serve as "epitaxial control" layers that permit otherwise unstable (or merely metastable) compositions to persist indefinitely. The epitaxial control layer(s) are generally prepared by processing to remove surface contaminants including adsorbed carbon and water vapor prior to film formation. Magnetic moments per atom greater than or equal to $1.5\mu_B$, $1.7\mu_B$, $1.9\mu_B$, $2.0\mu_B$, $2.2\mu_B$, $2.5\mu_B$, $3.0\mu_B$, or $3.25\mu_B$ can be obtained depending on ternary compositions. In many examples, magnetic moment per atom exceeds the Slater-Pauling limit of $2.45\mu_B$/atom.

The disclosed films can be referred to as "stable" in the sense that they tend to remain in the body centered cubic (bcc) or body centered tetragonal (bct) structure in which they are formed. Here, the term bcc is used generically to include films that have an in-plane lattice in registry with the substrate surface net, but due to the in-plane lattice mismatch the films as formed may exhibit a bct structure that can correspond to deviations and distortion of a bcc structure. While some examples are described using "bcc" or "bct," either or both can be used. Such distortions may enhance or reduce the overall magnetic moment or magnetization density while also improving film stability.

The disclosed examples describe particular approaches to producing ternary alloys and other films. These examples use molecular beam epitaxy (MBE), but other thin film deposition methods can be used such as sputtering (including magnetron sputtering, electron beam sputtering, or ion sputtering), e-beam evaporation, pulsed laser deposition, chemical vapor deposition or other processes. These processes can be more convenient and economical for film manufacturing. Magnetic memory, magnetoresistance structures, spin torque structures, heat assisted magnetization reversal memory, magnetic hard drives, and spin tunnel junctions can include and benefit from EEMLs as disclosed herein. So-call spintronic devices such as GMR valves, magnetic tunnel junctions, semiconductor spintronic devices, and spin qubits can include the disclosed EEML-enhanced materials.

For convenient description, examples are described with reference to ternary compositions, but compositions of four or more constituents can also be used such as $Fe_wCo_xMn_yCr_z$. The term "composition" is used to refer to materials that can have suitably large magnetic moments.

As illustrated in FIG. 1A, a typical magnetic film 150 includes a layer 154 of a ternary composition or other magnetic composition (an EEML) that is coupled to an epitaxial control layer (ECL) 152, i.e., a structure or layer that determines or influences the lattice spacing or structure of another layer such as a prior or subsequent layer. (The layers of FIG. 1A are not to scale.) The ECL 152 can be situated on a substrate, and various layers such as one or more buffer layers, diffusion barriers, or other layers can be interposed between such a substrate and the ECL 152 or between the ECL 152 and the magnetic composition layer 154. For example, an Fe layer can be used as a diffusion barrier. Fe can serve primarily as a diffusion barrier when used with an MgO ECL layer as it tends to retain the lattice constant of MgO over its thickness. Epitaxial control layers such as suitable crystal surfaces of MgO, ZnSe, GaAs, or epitaxial layers of these or other materials that are designed to determine or influence the lattice spacing of an intended ternary composition tend to produce stable ternary films of otherwise unstable materials. Such epitaxial control layers permit the formation of a strained crystalline or polycrystalline epitaxial film, and render the film stable after formation. A substrate such as MgO, ZnSe, or GaAs may serve as the epitaxial control layer as well, and a separate epitaxial control layer is not then required. Similarly, a separate substrate is not required, but can provide mechanical support, electrical or thermal isolation, or be adapted as needed for a particular application.

Depending on the deposition technique used, the elements composing the ternary films can be deposited simultaneously or sequentially. Sequential deposition requires many cycles of elemental deposition, each cycle resulting in a fraction of a monolayer to assure film homogeneity. Simultaneous deposition can, in the case of molecular beam epitaxy, use multiple evaporation sources.

Ternary film composition can vary along the Z-axis of the coordinate system 109 shown in FIG. 1A due to deliberate or inadvertent process variations as well as due to relative distance from epitaxial control layers. Typically, at larger distances from the epitaxial control layer, ternary crystal structure is less distorted by the epitaxial control layer (due, for example, to lattice mismatch). While ternary films can exhibit single crystal structure along an XY-plane, in many examples, ternary films are polycrystalline in the XY-plane. Lack of longer range crystalline structure may permit ternary films to exhibit their natural crystal structure more readily and tend to avoid some of the distortions associated with lattice mismatch. In some examples, the substrate is silicon and an epitaxial control layer is situated on a surface of a silicon substrate. In other examples, the epitaxial control layer is a portion of the substrate. As discussed above, additional layers such as adhesion layers, strike layers, barrier layers, thermal and/or electrical isolation layers, and/or coefficient of thermal expansion matching or compensating layers can be provided at a substrate, between epitaxial control layers and the ternary composition (magnetic layers), or at other locations. Cap layers can be provided to reduce ternary composition oxidation, substrate/film intermixing, or to otherwise protect the ternary film. Similarly, capping layers may be included to both protect the film structure from post-growth processing steps and environmental degradation.

Distortion of ternary films can be quantified based on a ratio of out of plane lattice constant C to in-plane lattice constant A, wherein C/A=1 corresponds to body-centered cubic structure, while values such a 0.8 or 1.2 or other values are associated with lattice distortion such as associated with bct structures. In thicker films at locations more distant from the epitaxial control layer, C/A can tend to approach 1 (for an ideal bcc structure) or 1.4 (for an ideal fcc structure). While film structure tends to vary in the Z-direction, composition can also be made uniform or variable along the Z-direction (or other directions). For convenient description, ternary films are characterized using magnetic moment per atom, but magnetization density (magnetization per unit volume) can also be used but is typically more difficult to measure. It should be clear from this description that the magnetic moment per atom and the magnetization density are related but distinctly separate from one another.

For example, in some cases a film proximate an EEML can have a bct structure with C/A<1 or C/A>1, and as film thickness increases, C/A can converge to ~1 (if a lowest energy state is associated with a bcc structure) or to 1.4 or greater (if a lowest energy state is associated with an fcc structure). For many film thicknesses of practical interest, C/A generally remains approximately constant through the film thickness.

Figure 1B:
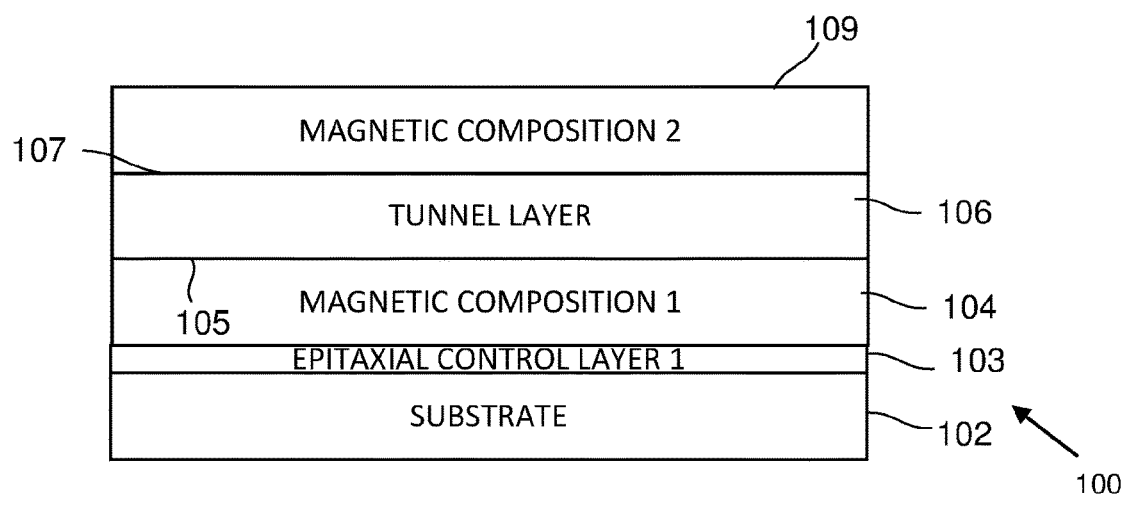
FIG. 1B-illustrates a representative magnetic tunnel junction that includes epitaxially enhanced magnetic layers.

Referring to FIG. 1B, a magnetic tunnel junction (MTJ) device 100 includes an ECL 103 situated on a substrate 102. The ECL 103 is associated with a first EEML 104 that is adjacent a first surface 105 of a tunnel barrier 106. A second EEML 109 is adjacent a second surface 107 of the tunnel barrier 106. The ECL 103 and the EEMLs 104, 109 can be the same or different materials. In some examples, the tunnel barrier 106 is an MgO layer, but other insulating layers can be used. In some examples, EEMLs serve as pinned magnetic layers, free magnetic layers, or both in a magnetic tunnel junction device, and the configuration of FIG. 1B is only a representative example. For clarity of illustration, conductor layers are not shown. In other applications, EEMLs are included in giant magneto-resonance (GMR) devices, which are similar to the MTJ device of FIG. 1B in which the insulating tunnel barrier is replaced with a conductive layer.

Figure 2:
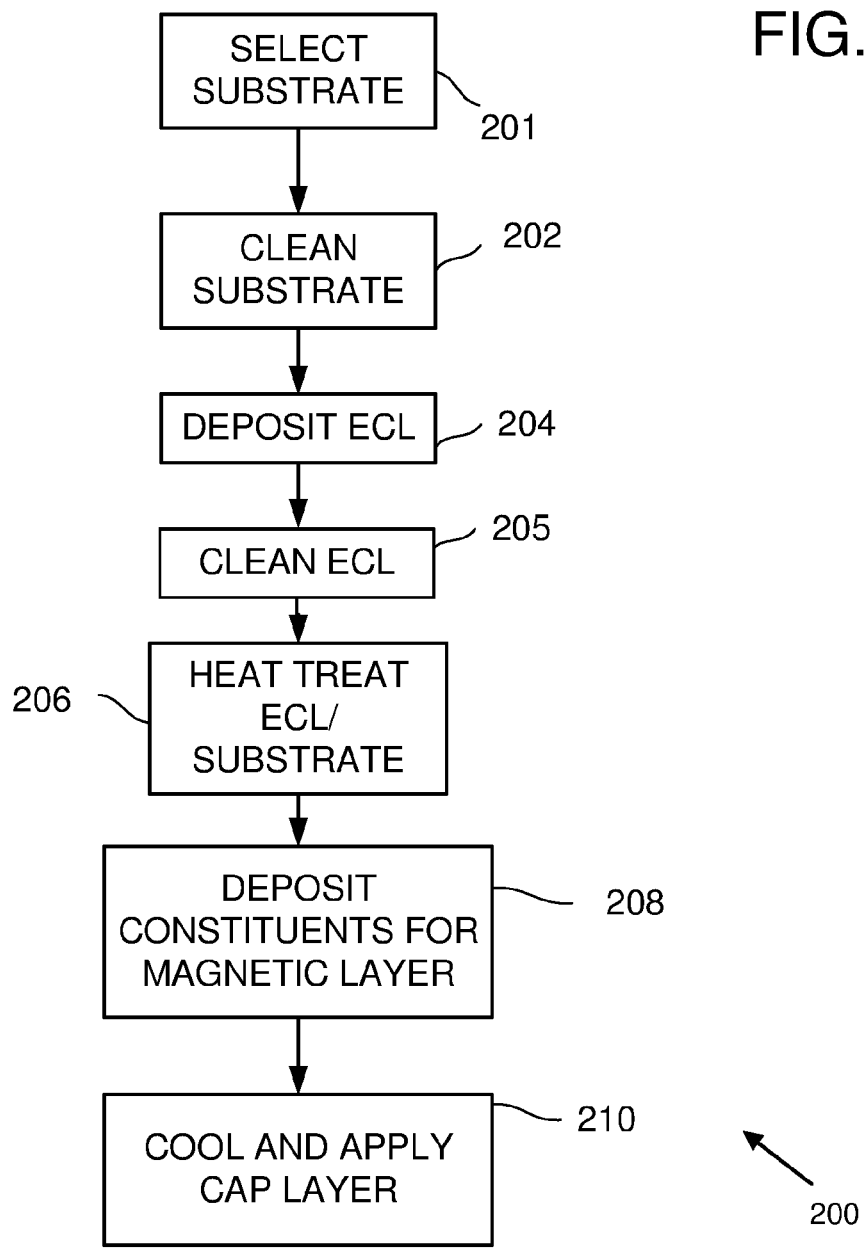
FIG. 2 illustrates a representative method of film fabrication.

Ternary films such as $Fe_xCo_yMn_z$ films and other films such as quaternary films can be synthesized using a method 200 illustrated in FIG. 2. At 201, a substrate is selected, and at 202, the selected substrate is cleaned. At 204, an epitaxial control layer (ECL) is formed on the substrate. In some examples, the ECL is a surface of a substrate and formation of an additional layer is not required. At 205, the ECL is cleaned using procedures developed specifically for each ECL and may include selective chemical etching, plasma or ozone cleaning, sonication and one or more rinses with solvents such as acetone or methanol. For hygroscopic ECLs such as MgO, deionized water rinses may be avoided, particularly as a final rinse. In some cases, the ECL is an epi-layer consisting of the same material as the substrate and is deposited to improve the quality, surface roughness, and crystallinity of the surface just prior to film deposition.

The substrate and ECL are then mounted and heat treated in a vacuum at 206 and constituents of the ternary materials are deposited in a vacuum at 208 using molecular beam epitaxy (MBE), sputtering, e-beam evaporation, pulsed laser deposition, chemical vapor deposition, ion beam, or other technique to form an epitaxially enhanced magnetic layer (EEML). Deposition is typically done with substrates/ECLs heated to temperatures greater than 100° C., 120° C., 140° C., 160° C., 180° C. or other temperatures. After deposition, at 210, the substrate/ECL/EEML structure is cooled to near room temperature and a cap layer may be applied such as an aluminum layer to reduce interlayer mixing and for protection from environmental degradation.

Figure 3:
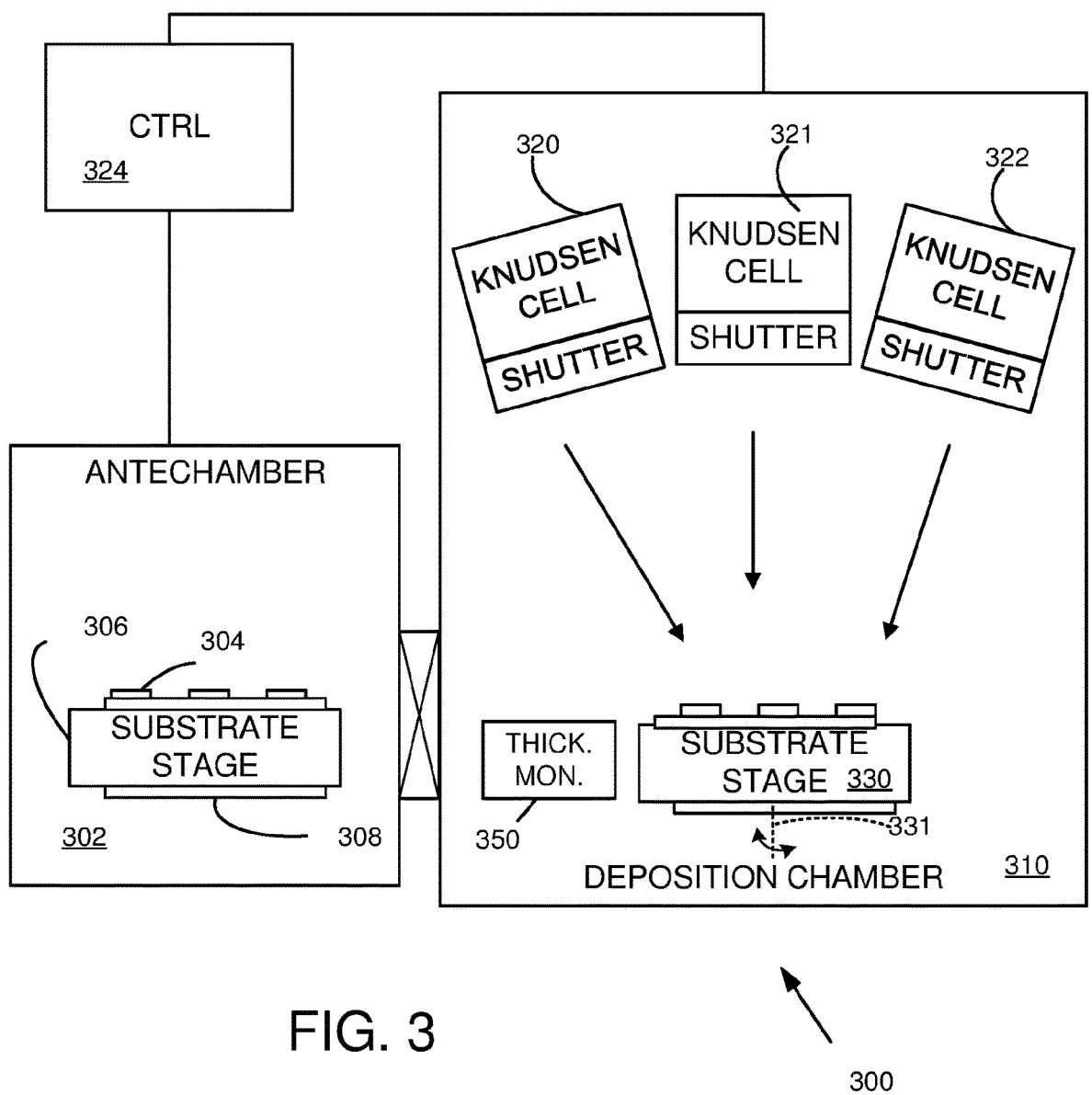
FIG. 3 illustrates a representative apparatus for film fabrication.

A representative deposition system 300 is illustrated schematically in FIG. 3. An antechamber 302 (or load-lock chamber) is situated to hold one or more substrates 304 on a substrate stage 306 that is coupled to a temperature controller 308 so that the substrates can be heat treated or otherwise prepared for deposition. The antechamber 302 is coupled to one or more vacuum pumps such as cryopumps or ion pumps so that heat treating can be performed at selected pressures, typically between about $1\times10^{-5}$ Torr and $1\times10^{-9}$ Torr. The antechamber 302 is coupled to a deposition chamber 310 via a gate valve and transfer mechanism 312 for movement of the substrate holder into the deposition chamber 310. The deposition chamber 310 is also coupled to one or more vacuum pumps such as cryopumps or ion pumps so that deposition can be performed at selected pressures, typically between about $1\times10^{-8}$ Torr and $1\times10^{-11}$ Torr. As shown in FIG. 3, three Knudsen sources 320-322 and associated shutters can each provide one of the three constituents of a ternary layer. Additional or fewer sources can be provided. A substrate stage 330 which supports the substrates is generally rotatable about an axis 331 to promote more uniform film deposition. The antechamber 302 and the deposition chamber 310 are coupled to a controller 324 that adjusts temperatures and pressures in each of the chambers as well as controlling Knudsen source temperatures and the associated shutters. Typically, all elements of the film are deposited simultaneously for film homogeneity, requiring independent control of the deposition cell temperatures. Additional sources can be provided for formation of cap layers, underlayers, or other layers as needed. Typically, a thin film monitor 350 is provided for process control. Substrate surfaces can be used as ECLs or layers deposited on a substrate surface can serve as ECLs.

Example: MBE Fabrication

In one example, $Fe_xCo_yMn_z$ ternary films are synthesized by molecular beam epitaxy (MBE) on 0.5 mm thick polished MgO(001) substrates (obtained from MTI Corporation) using separate effusion cells (such as Knudsen cells). Surfaces of the MgO(001) substrates serve as ECLs. The MgO substrates are sonicated for 5 minutes in acetone and then for 5 minutes in methanol. A final deionized (DI) water rinse is avoided due to the hygroscopic nature of MgO. The MgO substrates are then mounted using indium solder to a 3" diameter molybdenum sample puck and placed into a vacuum chamber via a load-lock antechamber. The MgO substrates are heat treated under vacuum at 800° C. for approximately 10 minutes prior to transfer into an MBE growth chamber. An insufficient treatment (due to, for example, low temperature or short time) or exposure to water vapor (due to, for example, improper substrate storage) can resulted in oxidation of a deposited film at an MgO interface due to adsorbed or absorbed water which diffuses to the interface.

Representative films were grown at a base pressure of $\sim1\times10^{-9}$ Torr with the substrate held at 160° C. Film composition was controlled by the Knudsen cell flux rates set by cell temperatures and calibrated by vibrating sample magnetometry (VSM). Films were deposited with all three elemental effusion cells operating simultaneously for film homogeneity. Substrates were cooled below 100° C. prior to deposition of an amorphous aluminum capping layer of thickness 3.5 nm to minimize interlayer mixing. Sample compositions were determined from integrated X-ray absorption spectroscopy (XAS) of the $L_3$-edge of the constituent components and used to verify relative flux rates. The Al cap layer was used in this case to prevent oxidation of the ternary film when exposed to the atmosphere. Other metal capping layers such as Au, Pt, V, or Cr as well as many oxide films can be used depending on the application. A dedicated cap layer may not be necessary in some applications, where the magnetic layer is covered by another layer.

Structural identification was monitored by Reflection High-Energy Electron Diffraction (RHEED). Due to lattice mismatch of the $Fe_xCo_yMn_z$ films with the underlying substrate, the films were likely tetragonally distorted from the bcc configuration to form a bct film. Since MgO is an insulating material, substrate charging can distort RHEED diffraction patterns, resulting in broad fuzzy lines. Still, the $Fe_xCo_yMn_z$ films generated RHEED patterns consistent with a bcc surface net rotated 45° with respect to the underlying MgO substrate.

Sample compositions were targeted from calibrated flux rates and determined from the area (after removal of the linear pre-edge background) of the XAS $L_3$ peak for Fe, Co, and Mn. In addition to the compositional determinations, individual atomic moments and total average moments were determined by X-ray magnetic circular dichroism (XMCD). These XMCD and XAS measurements are performed at Beamline 6.3.1.1 of the Advanced Light Source of Lawrence Berkeley National Laboratories with some measurements made at Beamline 4.0.2. The compositional and elemental moment data were collected sequentially at the same position on the sample. The XAS was acquired in total electron yield mode (sample current) while the photon energy was scanned through the Fe, Co, and Mn $L_{2,3}$-edges using linearly polarized soft-x-rays. The XMCD measurements of these same L-edges was acquired using elliptically polarized light with the soft-x-ray incident at 60° from normal incidence while the 0.1-0.5 T applied magnetic field was reversed (equivalently, the X-ray polarization could instead be reversed). Since the field is co-axial with the photon propagation direction, care must be taken to ensure that the moment remained in the sample plane by using the minimum magnetic field strength that results in a total moment reversal. This was verified by comparing XMCD values with those acquired using the vector magnetic field capability at beamline 4.0.2 where the magnetic field can be applied in the sample plane.

Any variation in XMCD intensity represents a change in the elemental moment. For accurate moment values, the moments extracted from the XMCD spectra were calibrated using a pure bcc Fe film with a known moment of 2.2 $\mu_B$/atom and a pure bcc Co film with a theoretical value of 1.65 $\mu_B$/atom. Theoretical values were used since the experimentally determined value of the Co moment varies from 1.5 to 1.7 $\mu_B$/atom. For the Mn moment calibration, a value of 3.0 $\mu_B$/atom for low Mn concentrations was used. Total average moment is a sum of the average individual moments weighted by the compositional fraction of the film (as determined by XAS).

Figure 4:
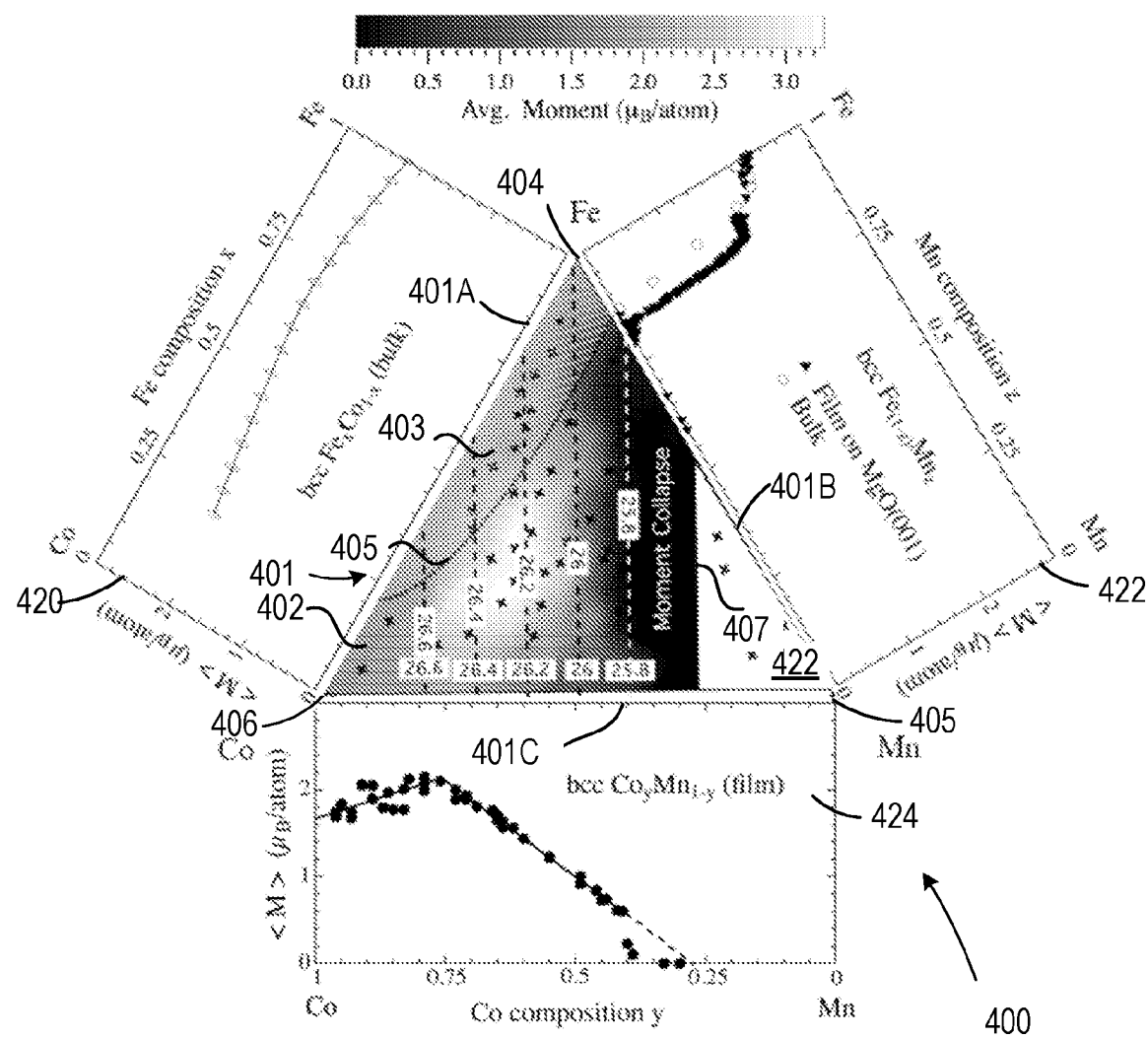
FIG. 4 shows average total atomic moment for 10 nm Fe$_x$Co$_y$Mn$_z$ films on MgO(001) as a function of composition. Measured values are shown as crosses.

With reference to FIG. 4, average atomic moment as a function of composition of a ternary alloy such as $Fe_xCo_yMn_z$ can be displayed in a triangular composition diagram 400 where the average atomic moment is represented by a color and the 3 edges 401A-401C of a triangle 401 represent each of the three composition variables (x, y, z) corresponding to Fe, CO, and Mn, respectively as shown in FIG. 4. A central portion 402 of FIG. 4 displays average atomic moment (in $\mu_B$/atom, independent of the type of atom) as a function of alloy composition for bcc (bct) $Fe_xCo_yMn_z$ films. The portion 402 can be obtained using a 3rd-degree polynomial spline interpolation of a sparse data set consisting of 48 ternary compositions, each represented by a cross, and binary alloy data associated with the triangle sides 401A-401C. Vertical dashed lines represent constant electron number for comparison to the Slater-Pauling curve. Electron number varies from 27.0 to 25.0 from left to right across the entire side 401C of the triangle 401, but vertical lines are provided only for five values from 26.6 to 25.8. Vertices 404, 405, 406 of the triangle 401 represent pure elements Fe, Mn, and Co, respectively. A maximum measured average atomic moment of 3.25±0.3 $\mu_B$/atom is shown, which exceeds the Slater-Pauling limit value of 2.4 $\mu_B$/atom.

Adjacent to each edge of the triangle are graphs of the average atomic moment for binary alloys for bulk and/or thin films (also grown on MgO). Graph 420 corresponds to bulk bcc $Fe_xCo_{1-x}$ (z=0) (see Weiss and Forrer, Ann. de Physique 12:279 (1929)) and includes the Slater-Pauling limit value of 2.4 $\mu_B$/atom at a $Fe_{70}Co_{30}$ composition, corresponding to an electron number of 26.3. Thin film MBE growth stabilizes the bcc structure to pure Co for deposition on GaAs(001) and MgO(001) surfaces for film thicknesses less than about 35 nm. Graph 422 corresponds to both bulk and thin film average moment values for bcc $Fe_{1-z}Mn_z$ (y=0). Graph 424 corresponds to films of bcc $Co_yMn_{1-y}$ (x=0) (note that the Co composition decreases to the right). The data points of these three binary alloy graphs represent the moment values along edges of the ternary alloy corresponding to the triangle 401. Although Mn is typically found to be anti-aligned to a host in transition metal alloys such as bulk, fcc CoMn, in bcc or bct CoMn the Mn is aligned to the Co and in FeMn the Mn moment is either very small or zero, or the Mn spin is frustrated. In the FeCoMn system, both spin configurations occur for the Mn while the Fe and Co are always aligned to each other. In the region of high total moment, the Mn is always aligned with the other two elements.

As disclosed herein, the bcc phase can be stabilized to 80% of the available ternary compositional space. The region of bulk stability for the α-phase (bcc) is from Matsui et al., J. Phys. Soc. Jp. 35:419-425 (1973) and is shown by the diagonal striped area 403 beginning at the apex 404 of the triangle 401, extending down most of the side 401A of the triangle, and bounded by a curved dashed line 405. A bcc (bct) stability region for the disclosed epitaxial films (as determined from the RHEED data) are the regions that are not white, extending from the curved dashed line 405 to a region of moment collapse 407. A small white area 422 at the bottom right of the triangle 401 represents a region that could not be stabilized as bcc (bct) and is exclusively in the region of high Mn compositions, corresponding fairly well to the onset of the β-phase in the bulk phase diagram. The line of instability is mainly inferred from the binary alloy with a few ternary growths used for confirmation. Note that the regions of high average moment (lightest grey) are for compositions that are not stable in the bulk.

In addition to the compositional labels for the triangular figure, the lines of constant electron number show that there are a large range of compositions with the same electron number for the $Fe_xCo_yMn_z$ alloys that have very different moment values. Interestingly, the thin film bcc ternary system is ferromagnetic above an electron number of 25.85 below which the moment collapses, most likely due to the onset of spin frustration or anti-ferromagnetism. The moment collapse is separate from the bcc instability which occurs near 25.55 electron number. The largest average atomic moment is found to be 3.25±0.3$\mu_B$/atom for an $Fe_{09}Co_{62}Mn_{29}$ film which corresponds to an electron number of 26.33±0.08, slightly higher than the Slater-Pauling value for binary alloys.

To estimate the magnetization density of these films, total film moment was measured by vibrating sample magnetometry (VSM) and the thickness measured by cross-sectional TEM measurements on a $Fe_{09}Co_{62}Mn_{29}$ film grown on a 5.0±0.1 mm×5.0±0.1 mm MgO(001) substrate. The total film moment was measured to be 3.14±0.04×10$^{-7}$ A-m$^2$ and the thickness was determined to be 5.8±0.5 nm. Assuming that the film area is the same as the substrate surface area (which ignores oxidation at the sample edges), the magnetization density for this composition is found to be 2.165±0.19×10$^6$ A/m (or 2.72±0.24 T) which is in excess of the Slater Pauling limit.

Figure 5:
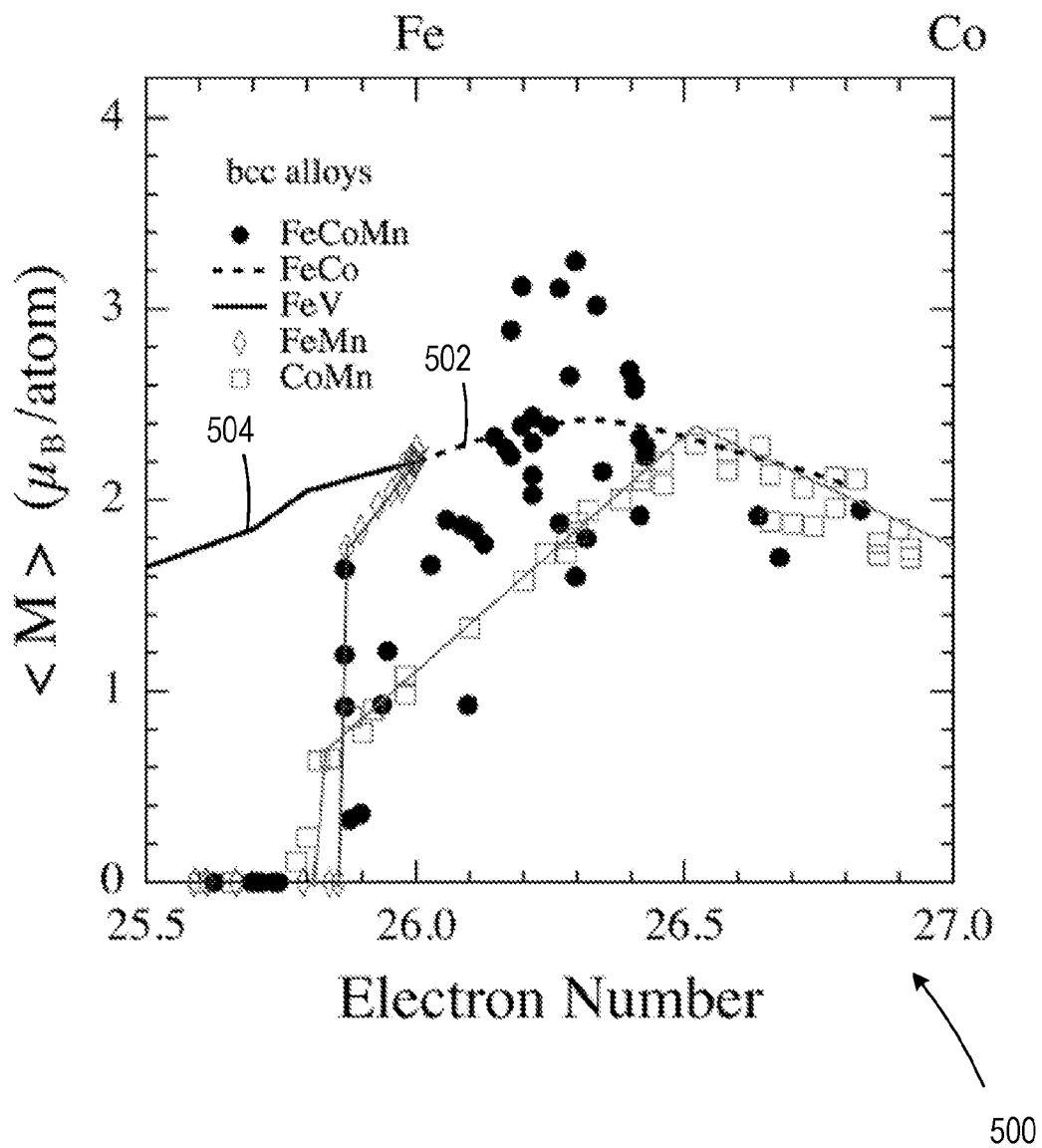
FIG. 5 shows average total atomic moment as a function of electron number for various Fe$_x$Co$_y$Mn$_z$ films and various binary alloys.

While FIG. 4 provides a detailed summary of moment values and compositions, moment data and associated compositions, but properties of the compositions can be displayed in other ways. For a direct comparison to the Slater-Pauling curve, the data can be displayed as a function of electron number as shown in FIG. 5 as a line plot 500 of average atomic moment data as a function of electron number for a range of electron numbers where the bcc phase is stabilized (25.5 to 27.0), but with electron number increasing from left to right. $Fe_xCo_yMn_z$ data are shown as filled circles, bcc $Fe_{1-z}Mn_z$ and the $Co_yMn_{1-y}$ film data are shown as open diamonds and open squares, respectively. Bulk bcc FeCo data is shown as a dashed line 502 and bulk FeV data is shown as a solid line 504.

Figure 6:
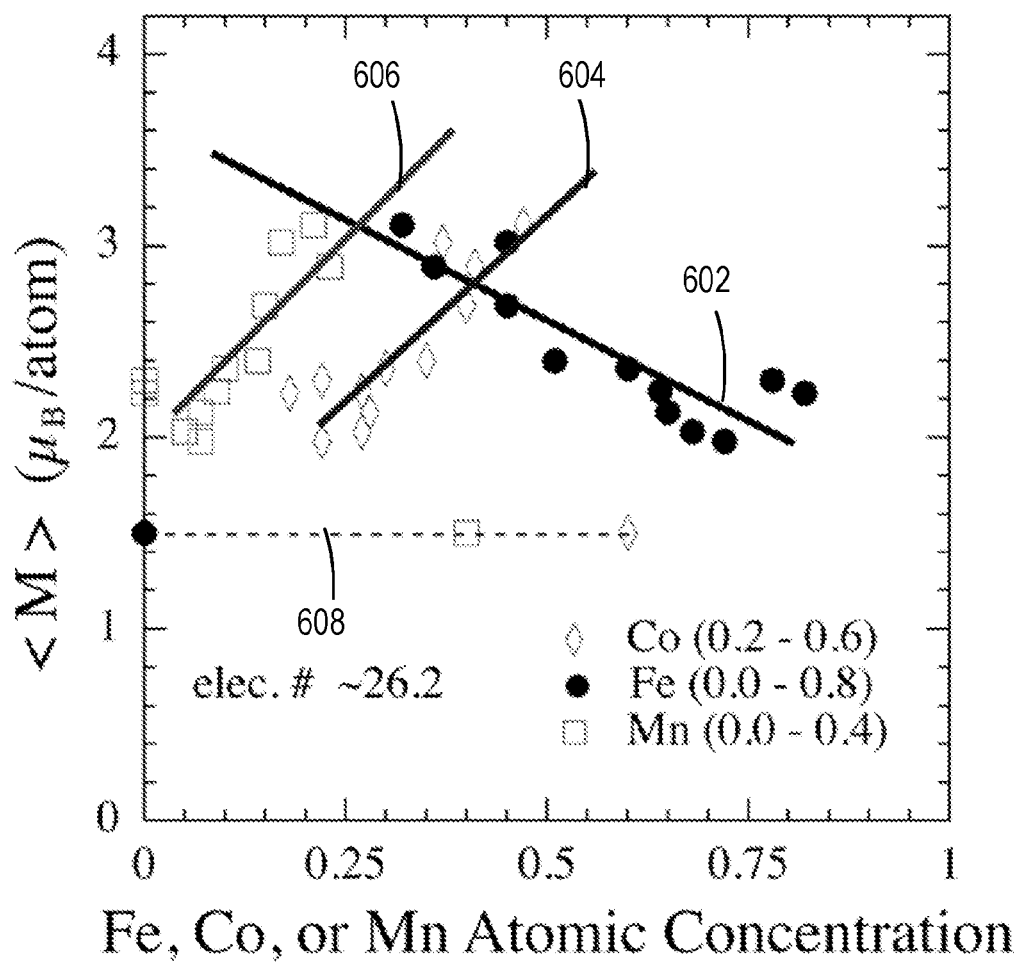
FIG. 6 shows average total atomic moment as a function Mn, Co, and Fe composition for various Fe$_x$Co$_y$Mn$_z$ films having an electron number of 26.2+10.05.

While binary alloy moment data is single valued, ternary data is multi-valued demonstrating that the Slater-Pauling formalisms lack utility for this ternary system. Moments above the Slater Pauling limit (peak in the FeCo line) are limited to electron numbers from 26.2 to 26.4. Furthermore, the moment collapse occurs at an electron number of 25.85±0.05 for all three Mn based alloys. The FeV alloy remains ferromagnetic well below this electron number, suggesting that the presence of Mn is intrinsic to the moment collapse. Having determined that the average atomic moment as a function of electron number is multivalued, it is informative to compare elemental atomic moment as a function of composition for a constant electron number. FIG. 6 displays average atomic moment as a function of Fe atomic concentration (black line 602 and filled circles), Co atomic concentration (blue line 604 and empty diamonds), and Mn concentration (red line 606 and empty squares) for films with an electron number of 26.2±0.05 electrons. Elemental atomic concentrations are from XAS measurements (used for the composition determination) and elemental moments are from MCD measurements to arrive at the average atomic moment. This restricted sample set includes 12 ternary alloys and also includes data for the x=0 point ($Co_{60}Mn_{40}$ binary alloy). Three data points, one for each elemental composition, are generated for each average atomic moment value.

Maintaining a constant 26.2 electron number restricts the available ranges for each element concentration to 0<z<0.4 for Mn, 0.2<y<0.6 for Co, and 0<x<0.8 for Fe. By fitting a linear least-squares fit to each elemental data set (excluding the $Co_{60}Mn_{40}$ data point) results in the three trend lines 602, 604, 606 which consistently show that the atomic moment is seen to increase with decreasing Fe content. Still, as Fe content is further reduced, the average total moment must subsequently decline to be in agreement with the low measured moment value of $Co_{60}Mn_{40}$ (occurring at x=0), indicated by the horizontal dashed line 608 at 1.5$\mu_B$/atom.

In additional examples, compositions with lower Fe content and electron numbers greater than 26.33 can be provided to obtain compositions with large moments. The addition of large moment Cr either as bcc FeCoCr or bcc FeCoMnCr may also exhibit enhanced magnetic moments.

As disclosed herein, in an example, bcc $Fe_xCo_yMn_z$/MgO (001) thin films have been synthesized for a large range of compositions and both the elemental net magnetic moments and the average atomic moment (independent of atom type) have been determined. Due to registry with the underlying MgO(001) substrate, the bcc (bct) structure of these compositions is stable for nearly 80% of available compositional space, compared to only ~20% for bulk alloys. Within the region of structural stability, the region that displays ferromagnetism corresponds to about 60% of available compositions as compared to about 25% for bulk materials, a number that includes both the entire bulk bcc structural range and the (~5%) hcp phase of Co. A maximum average moment is found to be $3.25\pm0.3\mu_B$/atom for an $Fe_{10}Co_{60}Mn_{30}$ film, well in excess of the Slater-Pauling limit value of $2.45\mu_B$/atom for an $Fe_{75}Co_{25}$ film. Stable compositions with such large moments are unavailable in bulk specimens.

Modeling of CoMn and CoCr by density functional theory simulations illustrates the control mechanism of an in-plane lattice parameter determined by the ECL, which when increased beyond the ground state value of the composition in bulk form, increases the stability and orientation of the ferromagnetic configuration of Mn in CoMn, or of Cr in CoCr. This mechanism is believed to contribute to both the alignment of individual magnetic moments and also their enhancement, in CoMn, CoCr, and in the ternary alloys of FeCoMn and others. The effect of increasing in-plane lattice parameters is to increase the volume per atom, to distort the crystal structure, and to effect a change in the lattice structure from fcc or fct structures to bcc or bct structures. These in turn reduce the number of nearest neighbors per atom, alter the symmetry of the crystal, and alter the many properties of the band structure. Altogether this produces a system in which the energy for ferromagnetic alignment and enhancement is optimized for increased in-plane lattice parameters.

Figure 8:
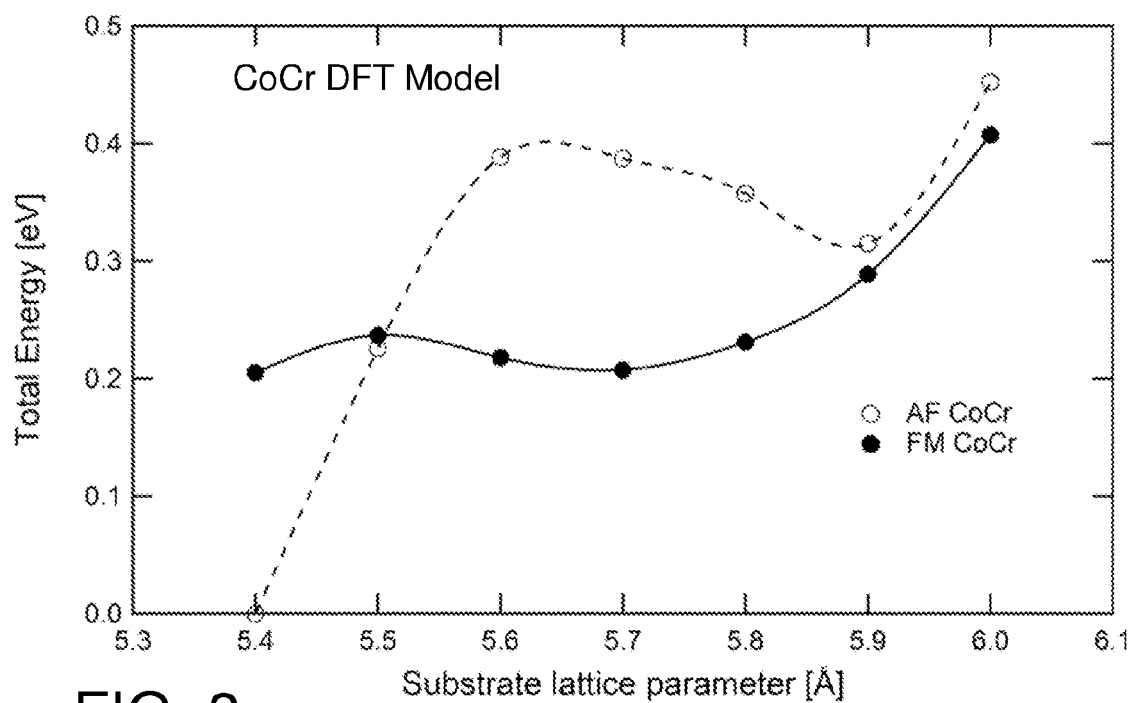
FIG. 8 is a graph of total energy of both ferromagnetically aligned (FM) and anti-ferromagnetically aligned (AF) states as calculated using density functional theory for CoCr.
Figure 9:
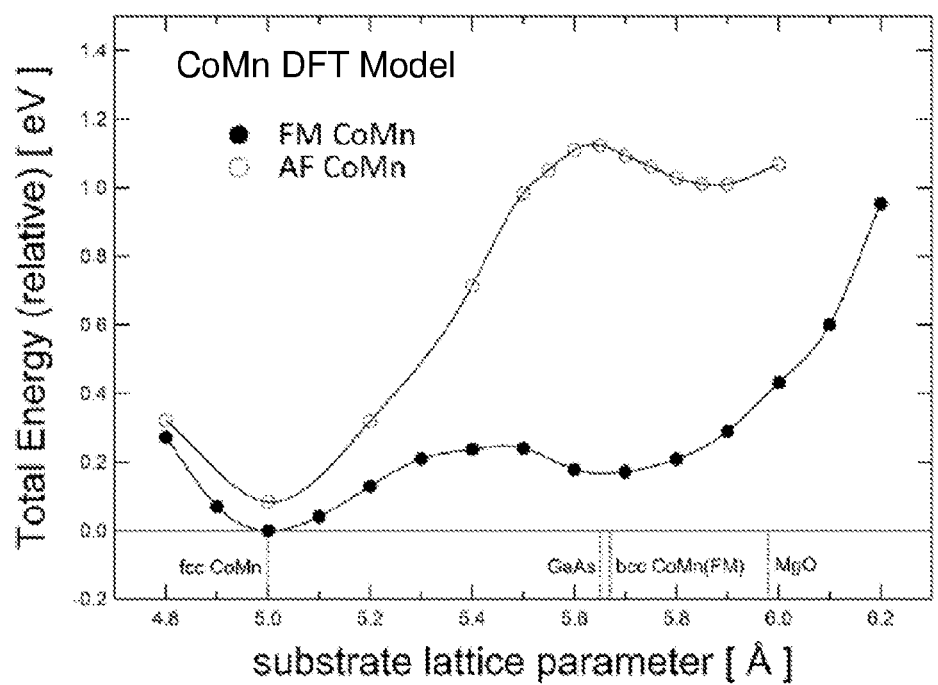
FIG. 9 is a graph of total energy of both ferromagnetically aligned (FM) and anti-ferromagnetically aligned (AF) states as calculated using density functional theory for CoMn.

FIGS. 8-9 are graphs of total energy of both the ferromagnetically aligned (FM) and anti-ferromagnetically aligned (AF) states as calculated using density functional theory for CoCr and CoMn, respectively The ground state (FM vs AF) at each in-plane lattice parameter is that of the lower of the 2 curves—the FM state in most cases. There is a transition expected in CoCr from the AF ground state to the FM state above 5.5 angstroms. The magnetic stability of the ferromagnetic alignment is correlated to the difference between in energy between the FM and AF states, so the ferromagnetic alignment is expected to be very stable in CoCr between 5.6 and 5.7 angstroms and very stable in CoMn above about 5.3 angstroms.

Figure 7:
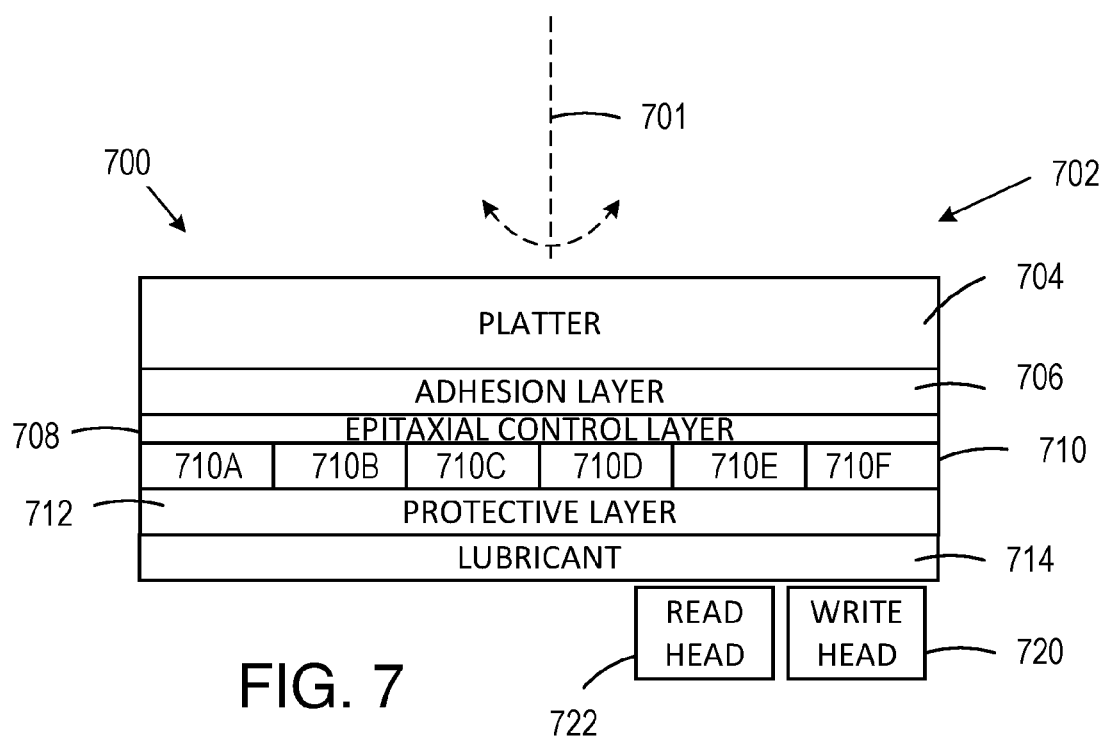
FIG. 7 illustrates a representative hard disk drive that includes a stabilized film.

FIG. 7 illustrates portions of a representative hard disk system 700 that includes a EEML 710 as described above. The hard disk system 700 includes a write head 720 that is situated to produce a selected magnetization in cells in the magnetic layer 710 such as cells 710A-710F and a read head 722 situated to detect magnetization of the cells 710A-710F. The write head 720 can be selected for in-plane or perpendicular recording, but typically perpendicular recording provides a higher writing density and is preferred. The read head 722 can be a giant magneto-resistance read head or a tunneling magneto-resistance read head. Incorporation of these ternary alloys for the magnetic layer should not require any modifications of this design, while improving the performance of the read/write head.

A disk 702 includes a disk platter 704 and one or more of an adhesion layer 706 and an epitaxial control layer 708 that is used to stabilize the magnetic layer 710. A protective layer 712 and a lubrication layer 714 can be provided for satisfactory operation when the disk 702 is rotated about an axis 701 for access by the read head 722 and a write head 720.

As hard-disk technology evolves and changes, the need for a high moment magnetic film component remains and these ternary films would improve their overall performance.

Other representative application of the disclosed materials include MRAM structures, spin-torque devices, other magnetic storage devices, and magnetic oscillators.

Having described and illustrated the principles of the disclosed technology with reference to the illustrated embodiments, it will be recognized that the illustrated embodiments can be modified in arrangement and detail without departing from such principles. The particular arrangements above are provided for convenient illustration, and other arrangements can be used. We claim all that is encompassed by the appended claims.

We claim:

1. A composition, comprising:
an epitaxially enhanced magnetic layer (EEML) consisting of one or more of $Fe_{x1}Co_{y1}Mn_{z1}$, $Fe_{x2}Co_{y2}Cr_{z2}$, $Fe_{x3}Co_{y3}V_{z3}$, and/or $Fe_wCo_{x4}Mn_{y4}Cr_{z4}$ or any mixture thereof wherein the EEML exhibits an average magnetic moment per atom of at least 2.45 $\mu_B$, wherein x1, y1, z1, x2, y2, z2, x3, y3, z3, w, x4, y4, and z4 are positive numbers such that x1+y1+z1=1, x2+y2+z2=1, x3+y3+z3=1, and w+x4+y4+z4=1, and $\mu_B$ is a Bohr magneton; and
an epitaxial control layer associated with a composition of the EEML.

2. The composition of claim 1, wherein the EEML has a thickness that is less than 100 nm.

3. The composition of claim 1, wherein the epitaxial control layer is one or more of MgO, ZnSe, and GaAs.

4. The composition of claim 1, wherein the EEML is $Fe_{x1}Co_{y1}Mn_{z1}$.

5. The composition of claim 4, wherein the epitaxial control layer is MgO(001).

6. The composition of claim 1, wherein the EEML is $Fe_xCo_yCr_z$.

7. The composition of claim 1, wherein the EEML is $Fe_xCo_yV_z$.

8. The composition of claim 1, wherein the EEML is $Fe_wCo_{x4}Mn_{y4}Cr_{z4}$.

9. The composition of claim 1, wherein an average magnetic moment per atom is greater than 3.0 $\mu_B$.

10. The composition of claim 1, wherein the EEML is $Fe_{x1}Co_{y1}Mn_{z1}$ and has an average magnetic moment per atom greater than 2.5 $\mu_B$.

11. The composition of claim 1, wherein an electron number is greater than 26.

12. A memory device, comprising the composition of claim 1.

13. A magnetic disk, comprising the composition of claim 1.

14. A composition, comprising:
one or more layers of any of $Fe_{x1}Co_{y1}Mn_{z1}$, $Fe_{x2}CO_{y2}Cr_{z2}$, $Fe_{x3}Co_{y3}V_{z3}$, and/or $Fe_wCo_{x4}Mn_{y4}Cr_{z4}$ or any mixture thereof having an average magnetic moment per atom of at least 2.5 $\mu_B$, wherein x1, y1, z1, x2, y2, z2, x3, y3, z3, w, x4, y4, and z4 are positive numbers such that x1+y1+z1=1, x2+y2+z2=1, x3+y3+z3=1, and w+x4+y4+z4=1, and µB is a Bohr magneton; and
an epitaxial control layer adjacent or near the one or more layers.

15. The composition of claim 14, wherein the epitaxial control layer is an MgO(001) layer.

16. The composition of claim 14, wherein the average magnetic moment per atom is at least 3.0 $\mu_B$.

17. The composition of claim 14, wherein the one or more layers have a total thickness that is less than 100 nm.

18. A method, comprising:
   selecting a composition is one or more of $Fe_{x1}Co_{y1}Mn_{z1}$, $Fe_{x2}Co_{y2}Cr_{z2}$, $Fe_{x3}Co_{y3}V_{z3}$ and/or $Fe_{w}Co_{x4}Mn_{y4}Cr_{z4}$ or any mixture thereof, wherein x1, y1, z1, x2, y2, z2, x3, y3, z3, w, x4, y4, and z4 are positive numbers such that x1+y1+z1=1, x2+y2+z2=1, x3+y3+z3=1, and w+x4+y4+z4=1;
   selecting an epitaxial control layer; and
   depositing the selected composition on the epitaxial control layer to produce an epitaxially enhanced magnetic layer (EEML) having a thickness that is less than 100 nm and an average magnetic moment per atom of at least 2.45 µB.

* * * * *